United States Patent
Shim

(10) Patent No.: US 9,704,596 B1
(45) Date of Patent: Jul. 11, 2017

(54) METHOD OF DETECTING ERASE FAIL WORD-LINE IN NON-VOLATILE MEMORY DEVICE

(71) Applicant: SAMSUNG ELECTRONICS CO., LTD., Suwon-si, Gyeonggi-do (KR)

(72) Inventor: Won-bo Shim, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/393,465

(22) Filed: Dec. 29, 2016

(30) Foreign Application Priority Data

Jan. 13, 2016 (KR) .................. 10-2016-0004397

(51) Int. Cl.
| | |
|---|---|
| G11C 16/06 | (2006.01) |
| G11C 16/34 | (2006.01) |
| G11C 16/14 | (2006.01) |
| G11C 16/04 | (2006.01) |
| G11C 16/26 | (2006.01) |
| G06F 11/10 | (2006.01) |
| G11C 29/52 | (2006.01) |

(52) U.S. Cl.
CPC ...... *G11C 16/3445* (2013.01); *G06F 11/1068* (2013.01); *G11C 16/0483* (2013.01); *G11C 16/14* (2013.01); *G11C 16/26* (2013.01); *G11C 29/52* (2013.01)

(58) Field of Classification Search
CPC .................................................. G11C 16/06
USPC .................................................. 365/185.22
See application file for complete search history.

(56) References Cited

U.S. PATENT DOCUMENTS

| | | | |
|---|---|---|---|
| 5,689,468 A | * | 11/1997 | Ihara ................ G11C 11/22 365/145 |
| 6,301,153 B1 | | 10/2001 | Takeuchi et al. |
| 7,414,891 B2 | | 8/2008 | Sivero et al. |
| 8,199,584 B2 | | 6/2012 | Park |
| 8,218,367 B2 | | 7/2012 | Hemink et al. |
| 8,315,093 B2 | | 11/2012 | Dong et al. |
| 8,379,454 B2 | | 2/2013 | Kochar et al. |
| 8,737,134 B2 | | 5/2014 | Shiino et al. |
| 9,047,970 B2 | | 6/2015 | Wan et al. |
| 9,053,978 B2 | | 6/2015 | Nam |
| 2002/0024835 A1 | * | 2/2002 | Thompson ............. G11C 7/06 365/117 |
| 2012/0008412 A1 | | 1/2012 | Park |
| 2013/0080718 A1 | | 3/2013 | Huh |
| 2013/0314989 A1 | * | 11/2013 | Wakisaka ......... G11C 11/5642 365/185.03 |

FOREIGN PATENT DOCUMENTS

| | | |
|---|---|---|
| JP | 2005-166158 A | 6/2005 |
| KR | 10-2011-0065759 A | 6/2011 |

\* cited by examiner

*Primary Examiner* — Harry W Byrne
(74) *Attorney, Agent, or Firm* — Lee & Morse, P.C.

(57) ABSTRACT

A method for operating a non-volatile memory device initially includes supplying an erase voltage to the memory cells. The memory cells are in cell strings in a three-dimensional structure. The method further includes performing a first read operation of the memory cells, performing a second read operation of the memory cells, and then performing a first erase verify operation based on results of the first and second read operations. The first erase verify operation may include performing a first exclusive-or (XOR) operation on the first and second read operation results.

20 Claims, 16 Drawing Sheets

METHOD OF DETECTING ERASE FAIL WORD-LINE IN NON-VOLATILE MEMORY DEVICE

CROSS-REFERENCE TO RELATED APPLICATION

Korean Patent Application No. 10-2016-0004397, filed on Jan. 13, 2016, and entitled, "Method of Detecting Erase Fail Word-Line in Non-Volatile Memory Device," is incorporated by reference herein in its entirety.

BACKGROUND

1. Field

One or more embodiments described herein relate to a method of detecting erase fail word-line in a non-volatile memory device.

2. Description of the Related Art

In order to improve integration, semiconductor memory devices have been developed to have a three-dimensional structure. When the number of program/erase operations in a three-dimensional memory device increases, electrons may be trapped in a memory cell or a specific word-line may rapidly deteriorate. As a result, the threshold voltage of a memory cell may not sufficiently decrease, even during an erase operation. Also, a memory cell with a high threshold voltage may be passed in an erase verify operation. This is because the memory cell has comparatively less resistance elements than other memory cells in a cell string. Consequently, the erase verify operation may be processed as an erase pass, which may adversely affect performance.

SUMMARY

In accordance with one or more embodiments, a method is provided for operating a non-volatile memory device which includes a plurality of cell strings, each of the cell strings including a plurality of memory cells. The method includes supplying an erase voltage to the memory cells of each of the cell strings; performing a first read operation by applying a first verify voltage to even word-lines connected to the memory cells of each of the cell strings and applying a high voltage to odd word-lines connected to the memory cells of each of the cell strings; performing a second read operation by applying the first verify voltage to the odd word-lines connected to the memory cells of each of the cell strings and applying the high voltage to the even word-lines connected to the memory cells of each of the cell strings; and performing a first erase verify operation by performing a first exclusive-or (XOR) operation on a result of the first read operation and a result of the second read operation.

In accordance with one or more other embodiments, a method is provided for operating a non-volatile memory device which includes a plurality of cell strings on a substrate, each of the cell strings including a plurality of memory cells stacked in a direction perpendicular to the substrate. The method includes supplying an erase voltage to the memory cells of each of the cell strings; performing a first erase verify operation by applying a high voltage to word-lines connected to the memory cells of each of the cell strings; with respect to the cell strings determined as an erase pass, as a result of the first erase verify operation, performing a first read operation by applying a first verify voltage to even word-lines of the word-lines connected to the memory cells and applying the high voltage to odd word-lines of the word-lines connected to the memory cells; performing a second read operation by applying the first verify voltage to the odd word-lines of the word-lines connected to the memory cells and applying the high voltage to the even word-lines of the word-lines connected to the memory cells; and performing a second erase verify operation by performing a first exclusive-or (XOR) operation on a result of the first read operation and a result of the second read operation.

In accordance with one or more other embodiments, a method for controlling a non-volatile memory includes performing a first read operation including applying a first voltage to a first number of word lines connected to a plurality of memory cells, and applying a second voltage to a second number of word lines connected to the memory cells; performing a second read operation including applying the first voltage to the second number of word lines, and applying the second voltage to the first number of word lines; and detecting an erase fail word-line based on results of the first and second read operations, wherein the first voltage is different from the second voltage.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
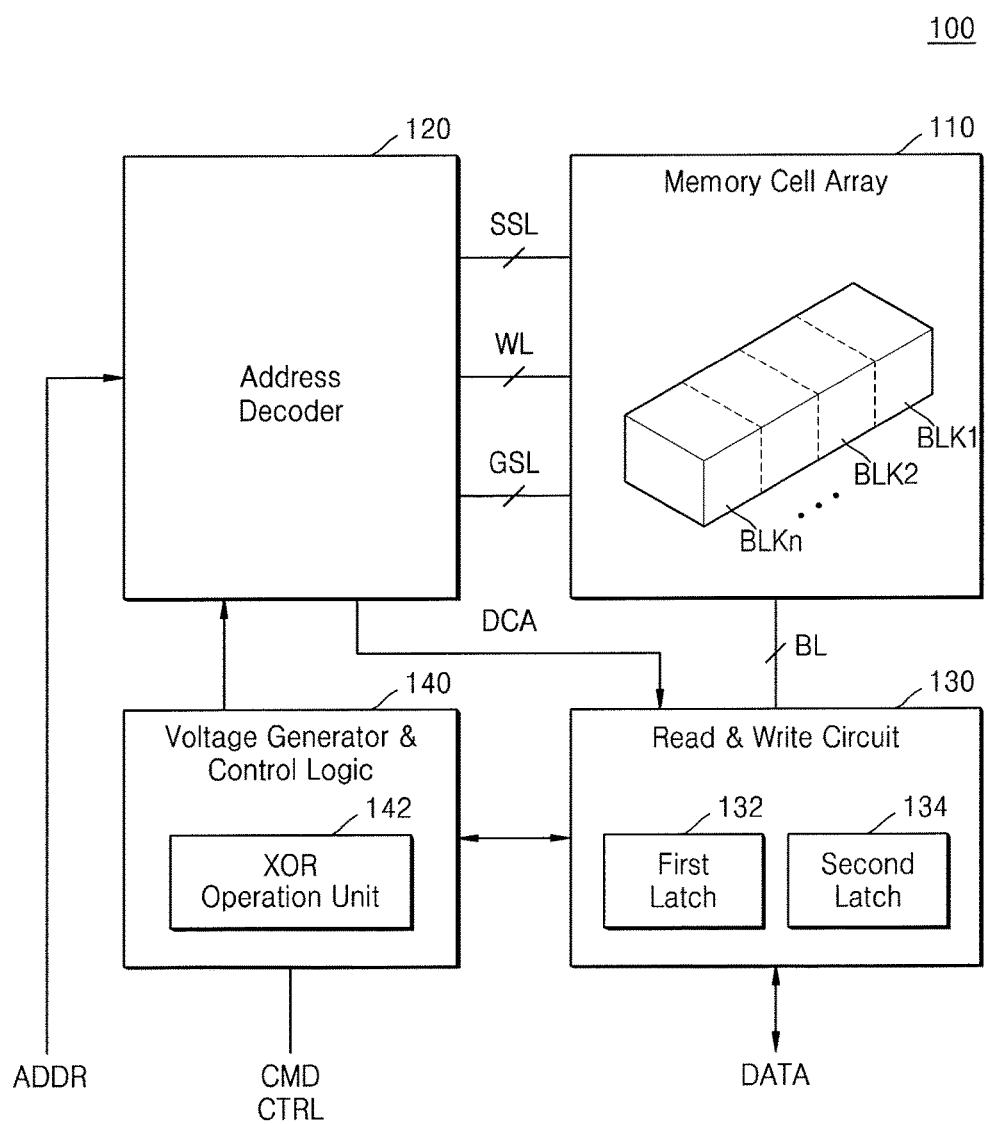
FIG. 1 illustrates an embodiment of a non-volatile memory device.

FIG. 1 illustrates an embodiment of a non-volatile memory device 100 which detects an erase fail word-line. Referring to FIG. 1, the non-volatile memory device 100 may include a memory cell array 110, an address decoder 120, a read and write circuit 130, and a voltage generator and a control logic 140. The non-volatile memory device 100 may be, for example, a NAND flash memory or another type of memory.

The memory cell array 110 may be connected to the address decoder 120 via string selection lines SSLs, word-lines WLs, and ground selection lines GSLs, and may be connected to the read and write circuit 130 via bit lines BLs. The memory cell array 110 may include a plurality of memory blocks BLK1 to BLKn.

Each of the memory blocks BLK1 to BLKn may include a plurality of memory cells and a plurality of selection transistors. The memory cells may be connected to the word-lines WLs. The selection transistors may be connected to the string selection lines SSLs or the ground selection lines GSLs. The memory cells of the memory blocks BLK1 to BLKn may be stacked in a direction perpendicular to a substrate to form a three-dimensional structure. Each of the memory cells may store one or more bits.

The address decoder 120 may be connected to the memory cell array 110 via the string selection lines SSLs, the word-lines WLs, and the ground selection lines GSLs. The address decoder 120 may operate in response to control of the voltage generator and the control logic 140. The address decoder 120 may receive an address ADDR from an external device.

The address decoder 120 may decode a row address of the received address ADDR. The address decoder 120 selects the string selection lines SSLs, the word-lines WLs, and the ground selection lines GSLs using the decoded row address. The address decoder 120 may receive various voltages from the voltage generator and the control logic 140 and may supply the received voltages to each of the selected and non-selected string selection lines SSLs, word-lines WLs, and ground selection lines GSLs.

The address decoder 120 may decode a column address of the received address ADDR. The decoded column address DCA is provided to the read and write circuit 130. In one embodiment, the address decoder 120 may include components such as a row decoder, a column decoder, an address buffer, etc.

The read and write circuit 130 is connected to the memory cell array 110 via the bit lines BLs and exchanges data with an external device. The read and write circuit 130 may operate in response to control of the voltage generator and the control logic 140. The read and write circuit 130 may receive the decoded column address DCA from the address decoder 120. The read and write circuit 130 may select the bit lines BLs using the decoded column address DCA.

The read and write circuit 130 may receive data DATA from an external device and may write the received data DATA to the memory cell array 110. The read and write circuit 130 may read the data DATA from the memory cell array 110 and may provide the read data DATA to an external device.

The read and write circuit 130 may include components such as a page buffer (or a page register), a column selection circuit, a data buffer, etc. The page buffer may operate as a write driver for temporarily storing data to write to the memory cells connected to a selected word-line or as a sensing amplifier for sensing and amplifying data read from the memory cells connected to the selected word-line.

The page buffer of the read and write circuit 130 may include latches 132 and 134 to store data read from the memory cell array 110 in an erase verify operation after an erase operation of the memory cell array 110. The latches 132 and 134 may store a result of performing reading by applying a high voltage or a verify voltage to the word-lines WLs connected to the memory cells of the cell strings in the memory cell array 110. The data stored in the latches 132 and 134 may be a result of erase verify reading.

According to an embodiment, the first latch 132 may store a result of erase verify reading with respect to even word-lines from among the word-lines WLs of the memory cell array 110. The second latch 134 may store a result of erase verify reading with respect to odd word-lines. In another embodiment, the first latch 132 may store the result of erase verify reading with respect to the odd word-lines, and the second latch 134 may store the result of erase verify reading with respect to the even word-lines.

The voltage generator and the control logic 140 may be connected to the address decoder 120 and the read and write circuit 130. The voltage generator and the control logic 140 may generate various voltages for operations related to program, read, and erase operations of the non-volatile memory device 100. The voltage generator and the control logic 140 may control general operations of the non-volatile memory device 100. The voltage generator and the control logic 140 may operate in response to a control signal CTRL and a command CMD provided from an external device or host.

The voltage generator and the control logic 140 may include a logic circuit unit 142 for detecting an erase fail word-line in an erase verify operation of the non-volatile memory device 100. The logic circuit unit 142 may serve as or include an operation unit for performing, for example, an exclusive-or (XOR) operation with respect to the data stored in the first latch 132 of the page buffer of the read and write circuit 130 and the data stored in the second latch 134 of the page buffer of the read and write circuit 130. Operation of one embodiment of the XOR operation unit 142 will be described later with reference to FIGS. 10A to 10C.

Based on a result of the XOR operation unit 142, the voltage generator and the control logic 140 may determine the erase verify operation as an erase fail when a threshold voltage distribution of the memory cells connected to the even word-lines and a threshold voltage distribution of the memory cells connected to the odd word-lines are different from each other when a voltage equal to or higher than a verify voltage is applied thereto.

Based on a result of the XOR operation unit 142, the voltage generator and the control logic 140 may determine the erase verify operation as an erase pass when a threshold voltage distribution of the memory cells connected to the even word-lines and a threshold voltage distribution of the memory cells connected to the odd word-lines are the same as each other, when a voltage equal to or higher than a verify voltage is applied thereto.

Figure 2:
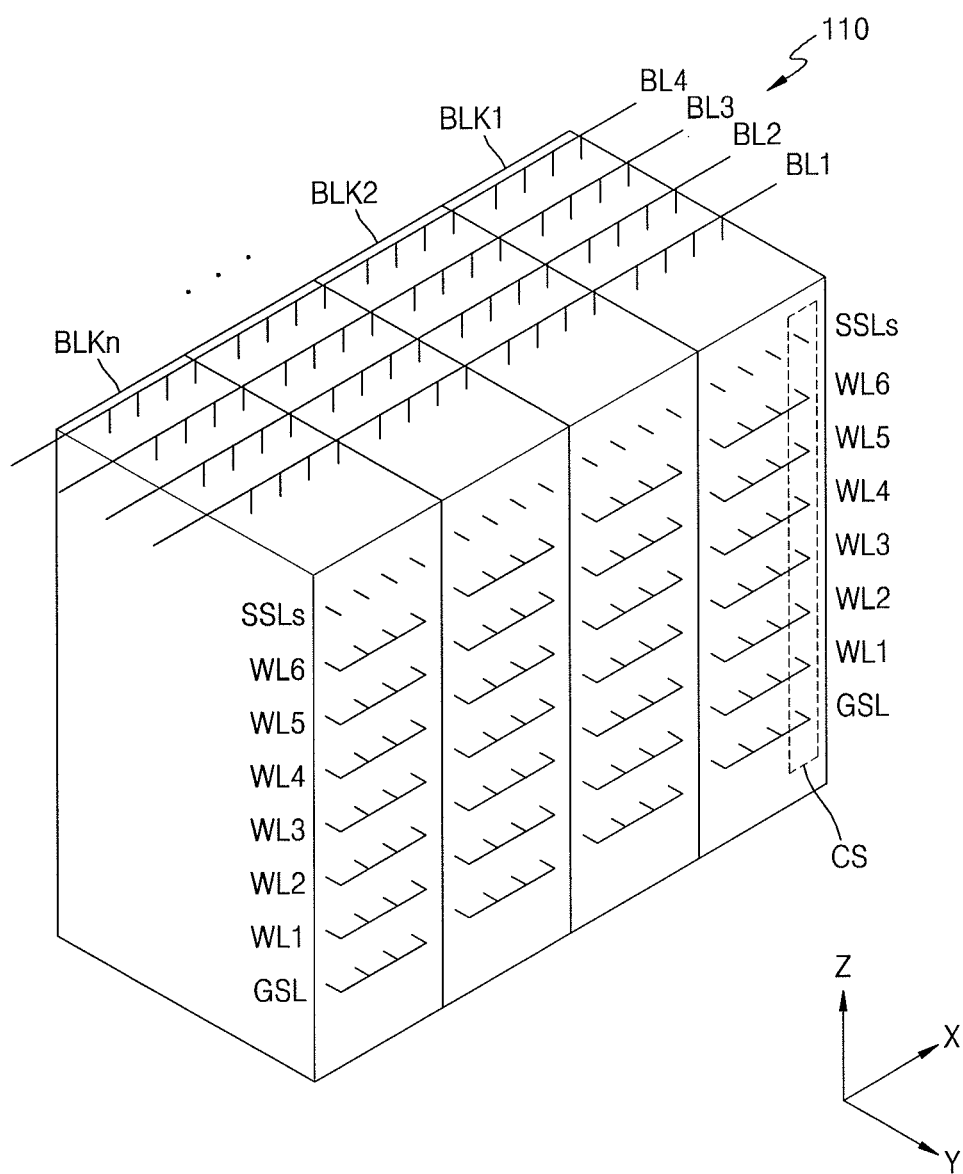
FIGS. 2 to 4 illustrate an embodiment of a memory cell array block.
Figure 3:
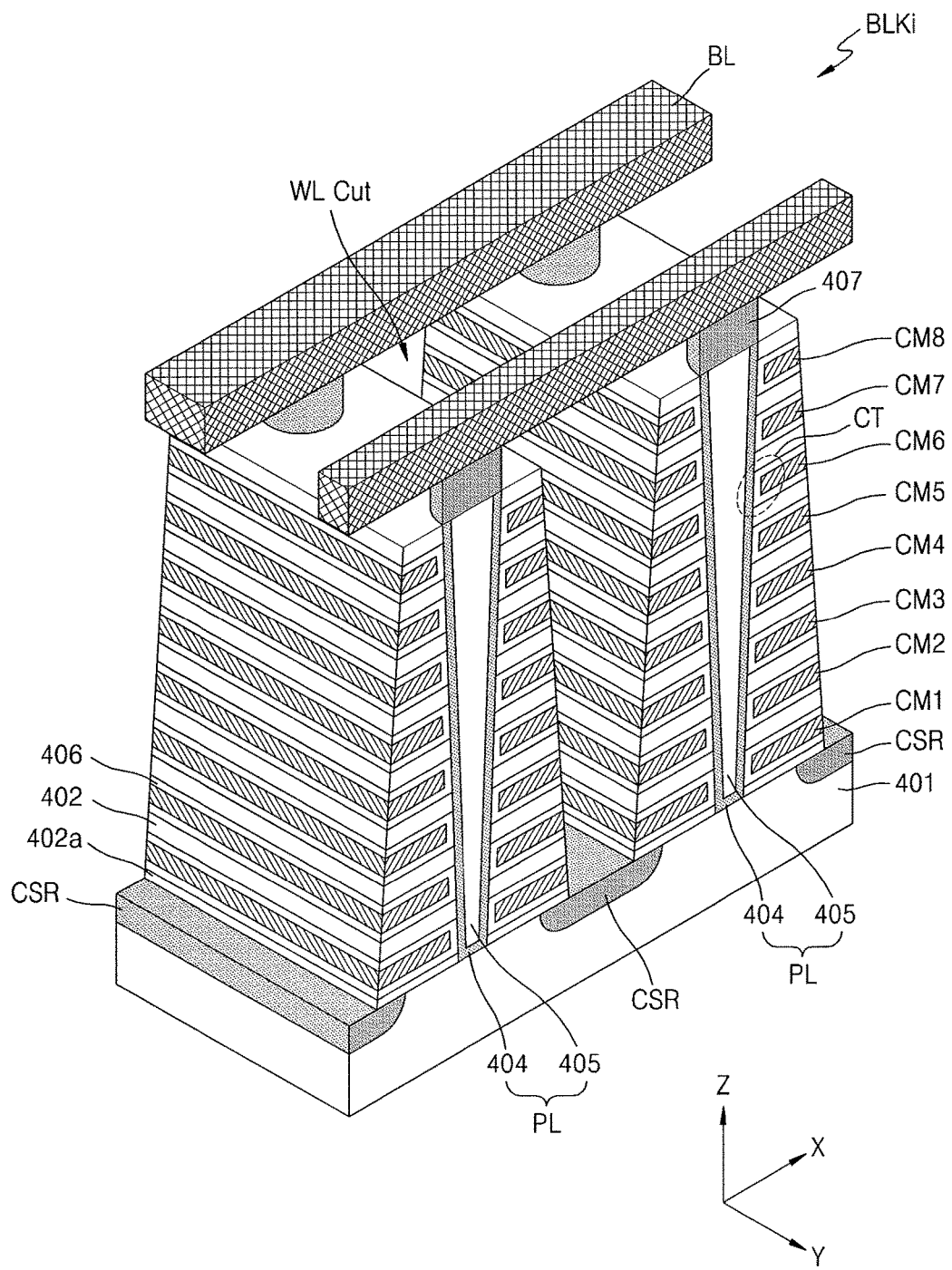
Figure 4:
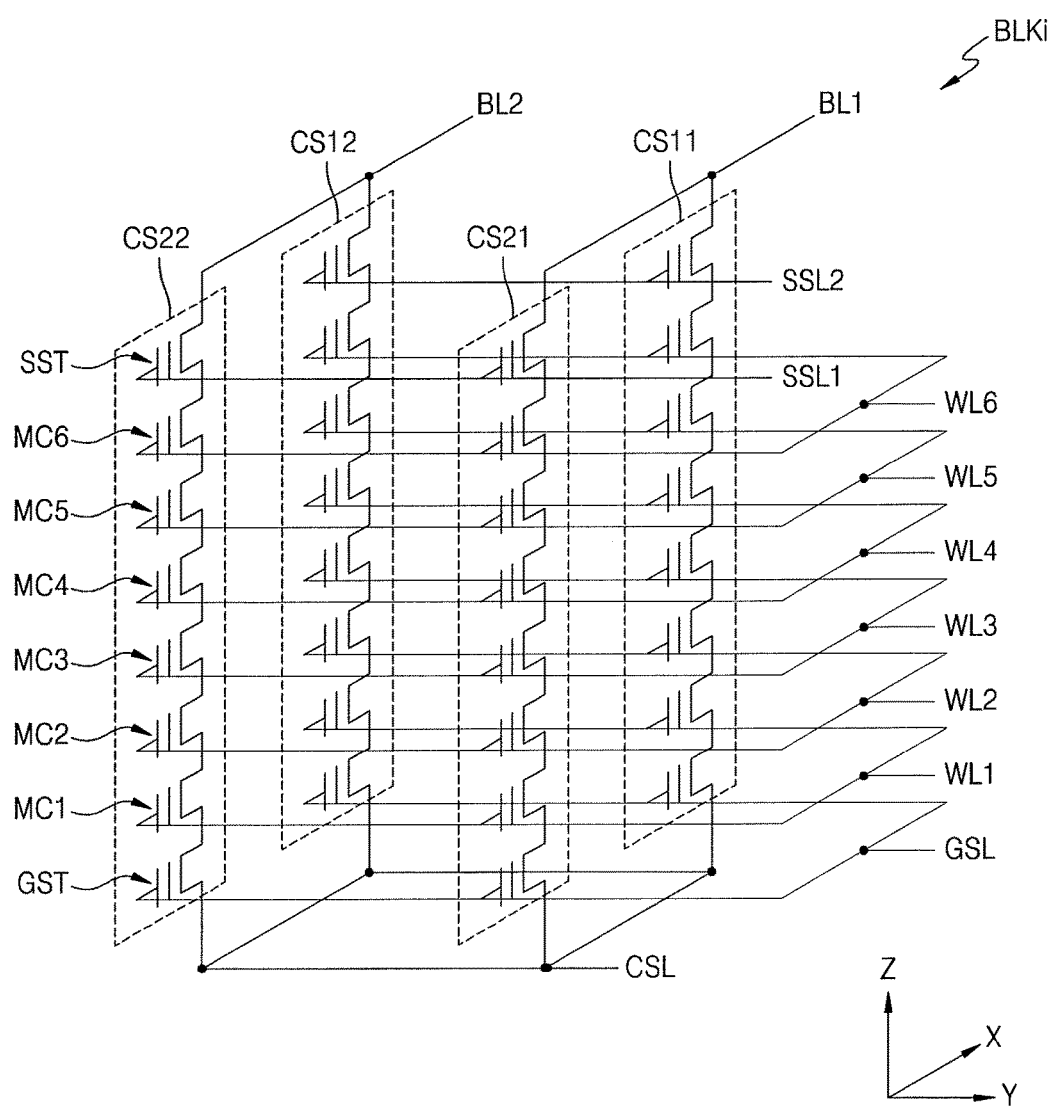

FIGS. 2 to 4 illustrate an embodiment of a plurality of memory blocks BLK1 to BLKn of the memory cell array 110 of FIG. 1. FIG. 2 illustrates an embodiment of the memory cell array 110. FIG. 3 is a perspective cross-sectional view of a portion of a memory block BLKi of the memory blocks BLK1 to BLKn of FIG. 2. FIG. 4 is a circuit diagram of the memory block BLKi.

Referring to FIG. 2, the memory cell array 110 includes the memory blocks BLK1 to BLKn, each of which has a three-dimensional structure (or a vertical structure). For example, each of the memory blocks BLK1 to BLKn may include structures extending in first through third directions (X, Y, and Z directions). Each of the memory blocks BLK1 to BLKn may include a plurality of cell strings CSs extending in the third direction (Z direction). The plurality of cell strings CSs may be spaced apart from each other in the first direction (X direction) and the second direction (Y direction).

Each of the cell strings CSs is connected to the bit line BL, the string selection line SSL, the word-lines WLs, the ground selection line GSL, and the common source line. The common source line is shown as a common source region CSR in FIG. 3. Each of the memory blocks BLK1 to BLKn may be connected to the bit lines BLs, the string selection lines SSLs, word-lines WLs, ground selection lines GSLs, and the common source line.

Referring to FIG. 3, the memory block BLKi includes three-dimensional structures extending in the first through third directions (X, Y, and Z directions). First, a substrate 401 is provided. For example, the substrate 401 may include a silicon material doped to have a first conductivity type, e.g., the substrate 401 may include a silicon material doped to have a p-conductivity type. The substrate 401 may be a p-conductive type well (for example, a pocket p well). Hereinafter, it is assumed that the substrate 401 includes p-conductive type silicon. However, the substrate 401 may be a material different from the p-conductive type silicon with a different conductivity type.

A plurality of common source regions CSRs extend on the substrate 401 in the second direction (Y direction) and are spaced apart from each other in the first direction (X direction). The common source regions CSRs may be commonly connected to one another to form the common source line CSL. The common source regions CSRs have a second conductivity type different from the conductivity type of the substrate 401. For example, the common source regions CSRs may have an n-conductive type.

A plurality of insulating materials 402a and 402 are sequentially provided on the substrate 401, in the third direction (Z direction) that crosses or is perpendicular to the substrate 401, between an adjacent pair of common source regions CSRs. The insulating materials 402a and 402 are spaced apart from each other in the third direction (Z direction) and extend in the second direction (Y direction). The insulating materials 402a and 402 may include an insulating material, e.g., a semiconductor oxide layer. The insulating material 402a of the insulating materials 402a and 402, which contacts the substrate 401, may be thinner than the insulating material 402.

A plurality of pillars PL are provided between the adjacent pair of common source regions CSRs and spaced apart from each other in the first direction (X direction). The pillars PL penetrate the insulating materials 402a and 402 in the third direction (Z direction). The pillars PLs may penetrate the insulating materials 402a and 402 to contact the substrate 401. The pillars PLs may include channel layers 404 and internal materials 405 in the channel layers 404. The channel layers 404 may include a semiconductor material (for example, silicon) having the first conductivity type, which is the same as the conductivity type of the substrate 401. The internal materials 405 may include an insulating material, such as a silicon oxide layer.

Information storage layers 406 are on exposed surfaces of the insulating materials 402a and 402 and the pillars PLS, between an adjacent pair of common source regions CSRs. The information storage layers 406 may store information by capturing or leaking charges.

Conductive materials CM1 through CM8 are on exposed surfaces of the information storage layers 406, between the adjacent pair of common source regions CSRS and between the insulating materials 402a and 402. The conductive materials CM1 through CM8 may extend in the second direction (Y direction) and may be separated from one another by a word-line cut WL cut on the common source regions CSRs. The word-line cut WL cut may extend in the second direction (Y direction) and may expose the common source regions CSRs. The conductive materials CM1 through CM8 may include a metal conductive material. The conductive materials CM1 through CM8 may include a non-metal conductive material, such as polysilicon. The conductive materials CM1 through CM8 may have first through eighth heights in order from the substrate 401.

A plurality of drains 407 are on the pillars PLs. The drains 407 may include a semiconductor material of a second conductivity type (for example, silicon). The drains 407 may extend above the channel layer 404 of the pillars PLs. Bit lines BLs are on the drains 407, extend in the first direction (X direction), and are spaced apart from each other in the second direction (Y direction). The bit lines BLs are connected to the drains 407. The drains 407 and the bit lines BLs may be connected to each other, for example, via contact plugs. The bit lines BLs may include a metallic conductive material or a non-metallic conductive material, such as polysilicon.

The pillars PLs form a plurality of cell strings together with the information storage layers 406 and the conductive materials CM1 through CM8. Each of the cell strings forms a plurality of cell transistors stacked in a direction perpendicular to the substrate 401. Cell transistors CTs include the conductive materials CM1 through CM8, the pillars PLs, and the information storage layer 406 between the conductive materials CM1 through CM8 and the pillars PLs.

The conductive materials CM1 through CM8 operate as gates (or control gates) of the cell transistors CTs. For example, the first conductive material CM1 may form ground selection transistors GSTs with the information storage layers 406 and the pillars PLs. The first conductive material CM1 may form one ground selection line GSL that is commonly connected as one. The second through seventh conductive materials CM2 through CM7 may form first through sixth memory cells MC1 through MC6 together with the information storage layers 406 and the pillars PLs. The second through seventh conductive materials CM2 through CM7 may form first through sixth word-lines WL1 through WL6. The eighth conductive material CM8 may form string selection transistors CST together with the information storage layers 406 and the pillars PLs. The eighth conductive material CM8 may form string selection lines SSL1 and SSL2.

Referring to FIG. 4, cell strings CS11, CS12, CS21, and CS22 are provided between the bit lines BL1 and BL2 and the common source line CSL. The cell strings CS11, CS12, CS21, and CS22 may include the string selection transistor SST connected to the string selection line SSL, the memory cells MC1 to MC6 connected to the word-lines WL1 to WL6, respectively, and the ground selection transistor GST connected to the ground selection line GSL.

Memory cells having the same height are commonly connected to one word-line. Thus, when a voltage is applied to a word-line of a specific height, the voltage is applied to all of the cell strings CS11, CS12, CS21, and CS22.

Each of the cell strings CS11, CS12, CS21, and CS22 having different rows is connected to the different string selection line SSL1 or SSL2. The first and second string selection lines SSL1 and SSL2 may be selected and non-selected so that the cell strings CS11, CS12, CS21, and CS22 may be selected and non-selected in a row unit.

The cell strings CS11, CS12, CS21, and CS22 are connected to the bit lines BL1 and BL2 in a column unit. The cell strings CS11 and CS21 are connected between the first bit line BL1 and the common source line CSL. The cell strings CS12 and CS22 are connected between the second bit line BL2 and the common source line CSL. The bit lines BL1 and BL2 may be selected and non-selected so that the cell strings CS11, CS12, CS21, and CS22 may be selected and non-selected in a column unit.

In the memory block BLKi, the number of rows of the cell strings may increase or decrease. When the number of rows of the cell strings changes, the number of string selection lines connected to the rows of the cell strings and the number of cell strings connected to one bit line may also change. When the number of rows of the cell strings changes, the number of ground selection lines connected to the rows of the cell strings may also change.

The number of columns of the cell strings may increase or decrease. When the number of columns of the cell strings changes, the number of bit lines connected to the columns of the cell strings and the number of cell strings connected to one string selection line may also change.

Heights of the cell strings may increase or decrease. For example, the number of memory cells stacked in each of the cell strings may increase or decrease. When the number of memory cells stacked in each of the cell strings changes, the number of word-lines may also change. For example, the number of string selection transistors or the number of ground selection transistors in each of the cell strings may increase. When the number of string selection transistors or the number of ground selection transistors in each of the cell strings changes, the number of string selection lines or the number of ground selection lines may also change. When the number of string selection transistors or the number of ground selection transistors increases, the string selection transistors or the ground selection transistors may be stacked in a shape that is, for example, the same as the shape of the memory cells MC1 through MC6.

In order to write data to the memory cells MC1 through MC6, first, an erase operation is performed so that the memory cells MC1 through MC6 have a predetermined negative (−) threshold voltage. The erase operation is performed in a unit of a block BLK1 through BLKn. Thereafter, a program operation is performed on a selected memory cell by applying a high voltage Vpgm to a word-line connected to the selected memory cell during a predetermined time.

During the erase operation, the bit lines BL1 and BL2 may be floated and the string selection lines SSL1 and SSL2 and the ground selection line GSL may be floated. A ground voltage VSS may be applied to the word-lines WL1 through WL6 and a high erase voltage Vers may be applied to the substrate 401 (see, e.g., FIG. 3). The erase voltage Vers applied to the substrate 401 is applied to the channel layers 404 (FIG. 3). The channel layers 404 may be charged with the erase voltage Vers. Due to a voltage difference between the ground voltage VSS applied to the word-lines WL1 through WL6 and the erase voltage Vers applied to the channel layers 404, charges captured in the memory cells MC1 through MC6 may be leaked. Accordingly, the threshold voltage of the memory cells MC1 to MC6 may decrease.

Figure 5A:
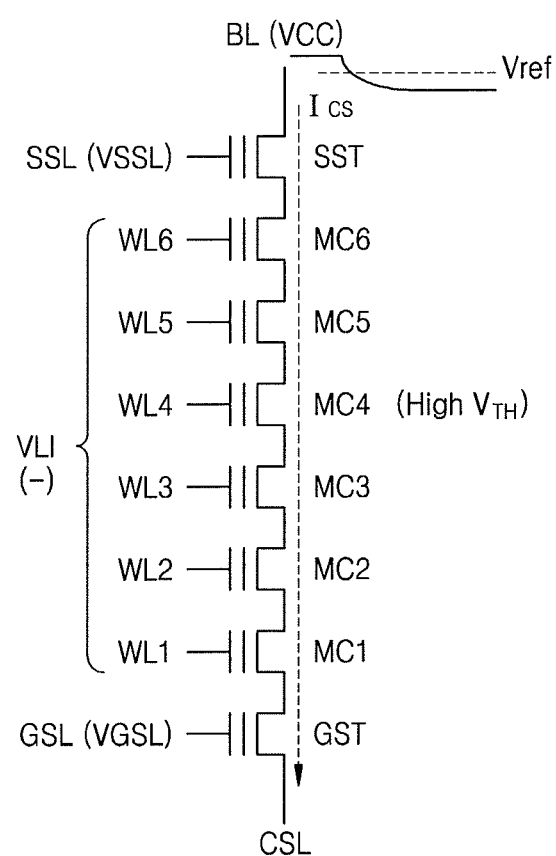
FIGS. 5A and 5B illustrate an embodiment of an erase verify operation.
Figure 5B:
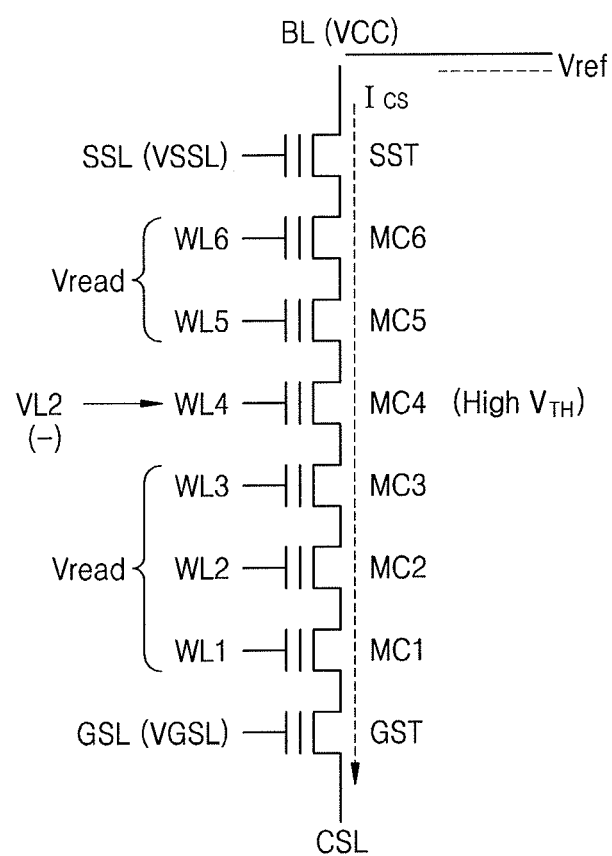

FIGS. 5A and 5B illustrate an embodiment of an erase verify operation of the memory cells MC1 to MC6 of FIG. 4. Referring to FIG. 5A, in order to verify whether the memory cells MC1 to MC6 have a negative (−) threshold voltage, a power voltage VCC is applied to the bit line BL. In order to turn on the string selection transistor SST and the ground selection transistor GST, a string selection voltage VSSL is applied to the string selection line SSL and a ground selection voltage VGSL is applied to the ground selection line GSL. For example, the string selection line voltage VSSL and the ground selection line voltage VGSL may be the power voltage VCC or a voltage that has a similar voltage level to the power voltage VCC. A negative (−) first read voltage VL1 may be applied to all of the word-lines WL1 through WL6.

When all of the memory cells MC1 to MC6 have a threshold voltage equal to or lower than the negative (−) first read voltage VL1, the power voltage VCC charged in the bit line BL may be discharged to the common source line CSL and the voltage of the bit line BL may decrease. The page buffer in the read and write circuit 130 (FIG. 1) may store, for example, logic low in a latch connected to the corresponding bit line BL, when the voltage of the bit line BL is lower than a predetermined reference voltage Vref. A result of erase verify reading may be provided to the voltage generator and the control logic 140, and the result of reading of logic low may be determined as an erase pass.

Among the memory cells MC1 through MC6, there may be a memory cell having a threshold voltage which does not sufficiently decrease. For example, when it is assumed that the memory cell MC4 has a high threshold voltage, the voltage of the bit line BL may be higher than the reference voltage Vref and the latch of the page buffer may store, for example, logic high. The result of reading of logic high may be determined as an erase fail by the voltage generator and the control logic 140.

However, when the voltage of the bit line BL is lower than the reference voltage Vref, the result of erase verify reading may be determined as an erase pass even, if the memory cell MC4 has the high threshold voltage. This may occur because the negative (−) first read voltage VL1 applied to the word-lines WL1 to WL6 is not sufficiently higher than the threshold voltage of the memory cells MC1 through MC6 (except MC4). Also, this may occur in the following circumstances. When the ratio of a resistance element of the memory cell MC4 to a resistance element of the memory cells MC1 to MC6 (except MC4) is relatively small, a difference between a cell string current Ics, flowing when there is an erase fail word-line to which the memory cell MC4 is connected, and a cell string current Ics, flowing when there is no erase fail word-line, is not large. Accordingly, the erase fail word-line may not be detected and the erase verify operation may be determined as an erase pass.

To solve this problem, a negative (−) second read voltage VL2 may be applied to only the selected word-line WL4 from among the word-lines WL1 through WL6 and a high voltage VH1 may be applied to the word-lines WL1 to WL3, WL5, and WL6, as illustrated in FIG. 5B. The second read voltage VL2 is a voltage having a lower voltage level than the first read voltage VL1, and may accurately identify whether a threshold voltage of the memory cell MC4 connected to the selected word-line WL4 has a similar voltage level to the negative (−) second read voltage VL1.

When the memory cell MC4 has a higher threshold voltage than the negative (−) second read voltage VL1, the cell string current Ics does not flow. Thus, the voltage of the bit line BL may be maintained as the power voltage VCC. The page buffer in the read and write circuit 130 (FIG. 1) may store, for example, logic high in the latch connected to the bit line BL when the voltage of the bit line BL is higher than the predetermined reference voltage Vref. The result of erase verify reading of logic high may be provided to the voltage generator and the control logic 140 and the erase verify operation may be determined as an erase fail.

Accurate verification may be performed if an erase pass/fail is determined separately for each of the word-lines WL1 through WL6, as illustrated in FIG. 5B. However, determination of an erase pass/fail separately for each of the word-lines WL1 through WL6 takes a lot of time. Hereinafter, embodiments of methods of detecting erase fail word-lines while reducing erase verify operation time will be described in detail with reference to FIGS. 6 through 11.

Figure 6:
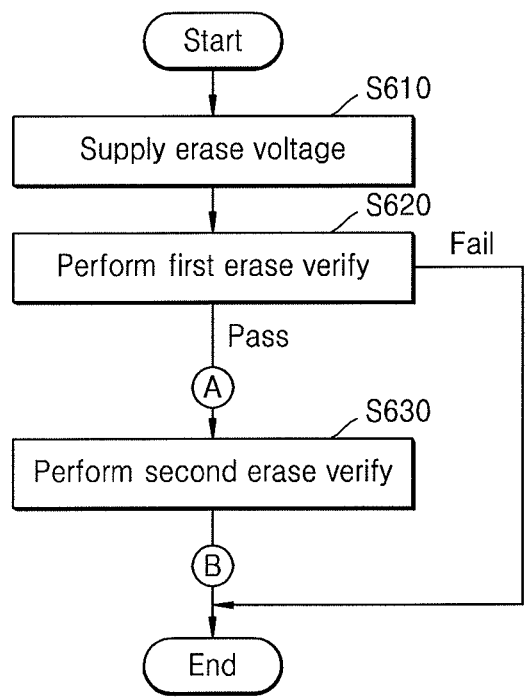
FIG. 6 illustrates a flowchart of an erase method according to an embodiment.
Figure 7:
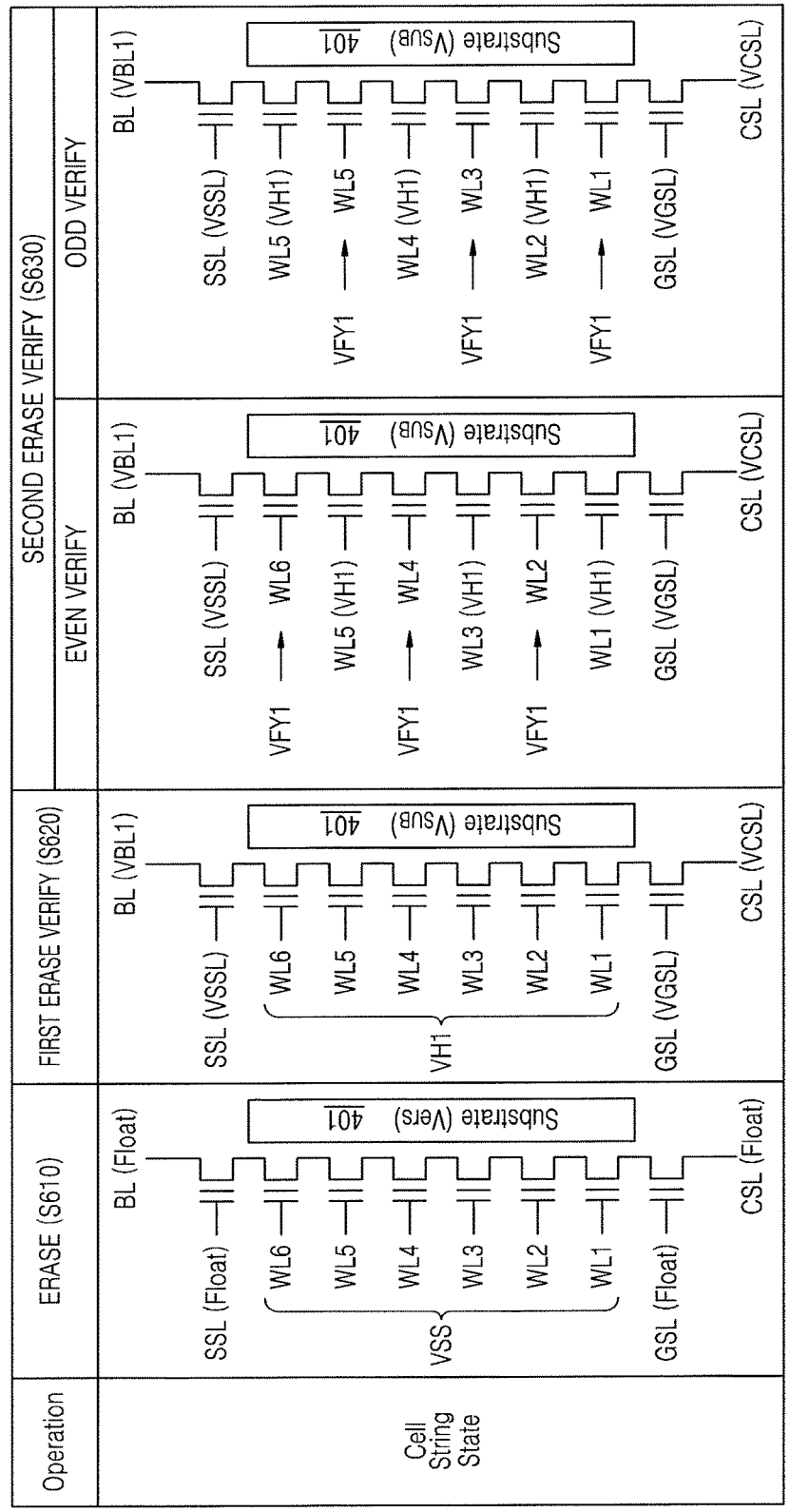
FIG. 7 illustrates an example of a state of a cell string during an erase operation.
Figure 8:
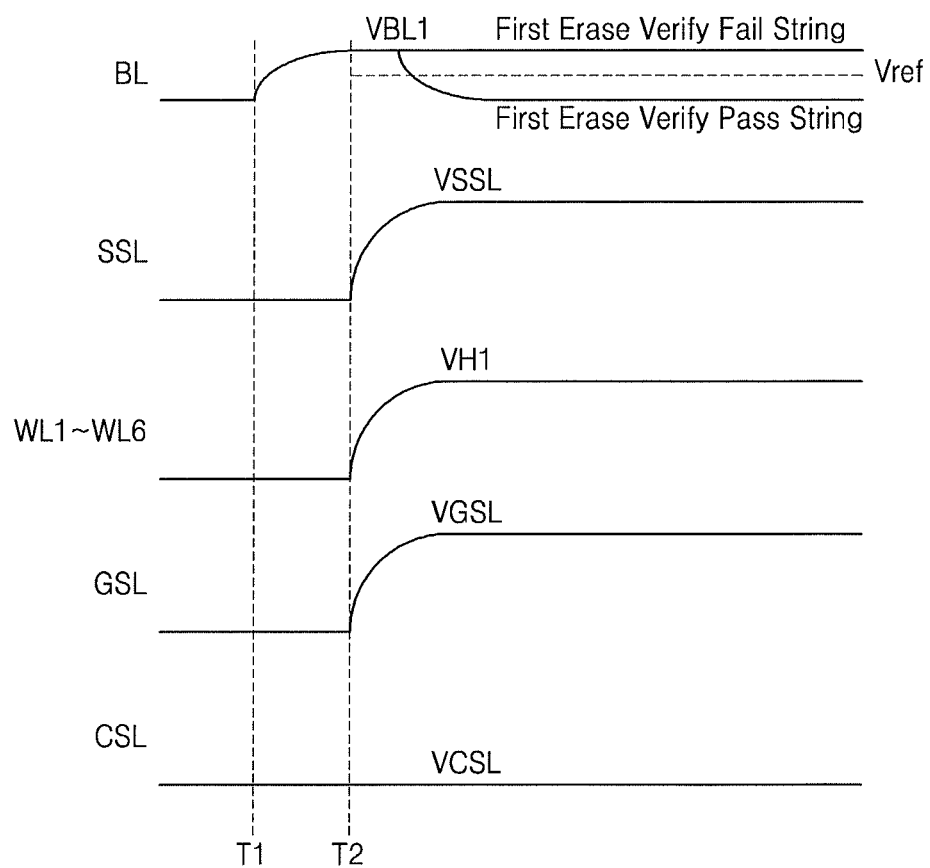
FIG. 8 illustrates a voltage change of a cell string during an erase operation.

FIG. 6 illustrates an embodiment of an erase method. FIG. 7 illustrates an example of a state of a cell string during an erase operation. FIG. 8 illustrates an example of a voltage change of the cell string during the erase operation.

Referring to FIG. 6 and FIGS. 1 and 7, an erase voltage is supplied in operation S610. The bit line BL may be floated, and the string selection line SSL, the ground selection line GSL, and the common source line CSL may be floated.

The ground voltage VSS may be applied to the word-lines WL1 through WL6. A high erase voltage Vers may be applied to the substrate 401. Due to the voltage difference between the ground voltage VSS applied to the word-lines WL1 through WL6 and the erase voltage Vers applied to the substrate 401, charges captured in the memory cells MC1 through MC6 may be leaked. Accordingly, a threshold voltage of the memory cells MC1 through MC6 may decrease.

According to one embodiment, the string selection line voltage VSSL or the ground selection line voltage VGSL may be applied to the string selection line SSL and the ground selection line GSL, respectively. The string selection line voltage VSSL may be a voltage to turn on the string selection transistor. The ground selection line voltage VGSL may be a voltage to turn on the ground selection transistor. A low voltage (including a positive (+) voltage and a negative (−) voltage), having a similar level to the ground voltage VSS, may be applied to the word-lines WL1 through WL6.

In operation S620, a first erase verify operation is performed by applying the high voltage VH1 to the word-lines WL1 through WL6. The high voltage VH1 may be a non-selected read voltage Vread that is applied to non-selected word-lines during a read operation.

A first bit line voltage VBL1 is applied to the bit line BL. The first bit line voltage VBL1 may be the power voltage VCC.

The string selection line voltage VSSL and the ground selection line voltage VGSL may be applied to the string selection line SSL and the ground selection line GSL, respectively, to turn on the string selection transistor SST and the ground selection transistor GST, respectively. According to an embodiment, the power voltage VCC or the non-selected read voltage Vread, that is applied to the non-selected word-lines during the read operation, may be applied to each of the string selection line SSL and the ground selection line GSL.

The common source line voltage VCSL is applied to the common source line CSL. The common source line voltage VCSL may be the ground voltage VSS or a low voltage (including a positive (+) voltage and a negative (−) voltage) having a similar voltage level to the ground voltage VSS.

A substrate voltage VSUB is applied to the substrate 401. The substrate voltage VSUB may be the ground voltage VSS or a low voltage (including a positive (+) voltage and a negative (−) voltage) having a similar level to the ground voltage VSS.

FIG. 8 illustrates an example of a voltage change of the cell string when the first erase verify operation (S620). Referring to FIG. 8, at time T1, a first bit line voltage VBL1 is pre-charged in the bit line BL. At time T2, a voltage is applied to each of the string selection line SSL, the word-lines WL1 through WL6, the ground selection line GSL, and the common source line CSL.

The string selection line voltage VSSL is applied to the string selection line SSL to turn on the string selection transistor SST. The high voltage VH1 is applied to the word-lines WLs to turn on the memory cells MC1 through MC6. The ground selection line voltage VGSL is applied to the ground selection line GSL to turn on the ground selection transistor GST.

In the cell string, when since the memory cells MC1 through MC6 are turned on and the first bit line voltage VBL1 charged in the bit line BL is discharged to the common source line CSL, the voltage of the bit line BL decreases and the voltage of the bit line BL becomes lower than the reference voltage vref. Thus, the cell string may be classified as a first erase verify pass string.

In the cell string, when one of the memory cells MC1 through MC6 is turned off, the voltage of the bit line BL may be maintained as the first bit line voltage VBL1 or may be higher than the reference voltage Vref. Thus, the cell string may be classified as a first erase verify fail string.

In operation S620, when the number of first erase verify fail strings in the memory block BLKi (FIG. 2) is equal to or higher than the number of bits of an error correction unit for correcting errors of data read from the non-volatile memory device 100 (FIG. 1), the memory block BLKi may be processed as an erase fail, and the erase operation may be ended.

In operation S620, when the number of first erase verify fail strings in the memory block BLKi (FIG. 2) is less than the number of bits of the error correction unit, the memory block BLKi may be processed as a first erase verify pass and operation S630 may be performed.

In operation S630, a second erase verify operation is performed. The second erase verify operation may include performing a first read operation with respect to even word-lines of the word-lines WLs connected to the cell strings in the memory block BLKi, performing a second read operation with respect to odd word-lines, and performing a first XOR operation on a result of the first read operation and a result of the second reading. An embodiment of the second erase verify operation will be described later with reference to FIGS. 9 to 11.

Figure 9:
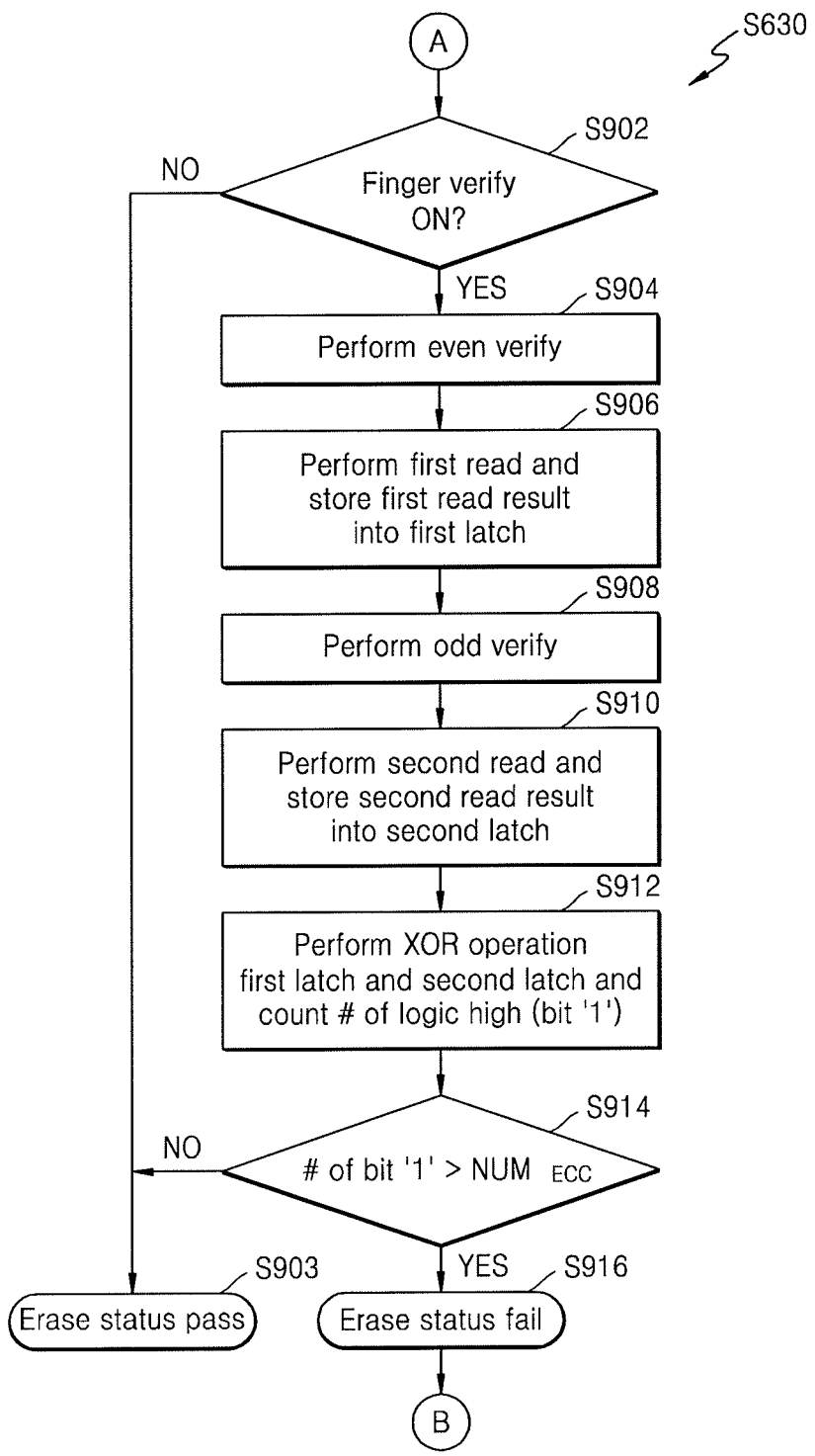
FIG. 9 illustrates an embodiment of an erase verify operation.
Figure 10A:
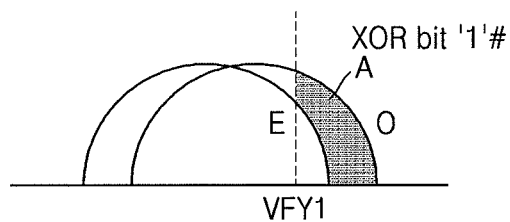
FIGS. 10A to 10C illustrate an example of a threshold voltage distribution of memory cells based on the result of a second erase verify operation.
Figure 10B:
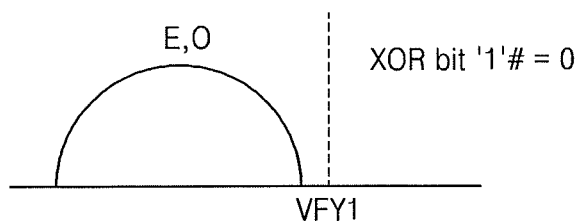
Figure 10C:
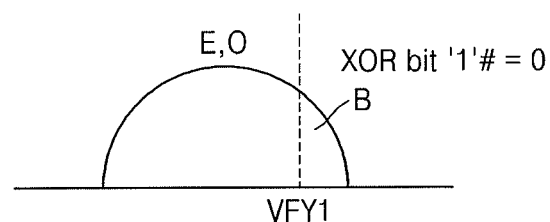

FIG. 9 illustrates an embodiment of an erase verify operation, and particularly the second erase verify operation of FIG. 2. FIGS. 10A to 10C illustrate examples of a threshold voltage distribution of memory cells based on a result of the second erase verify operation.

Referring to FIG. 9 and FIGS. 1 and 7, in operation S902, it is determined whether the memory block BLKi, which is processed as a first erase verify pass, is in a state of a finger verify operation. The finger verify operation may be controlled by the voltage generator and the control logic 140. When the finger verify operation is in a non-activated state (NO), operation S903 is performed.

In operation S903, the memory block BLKi, that is processed as a first erase verify pass, in the first erase verify operation (S620 of FIG. 6) may be processed as an erase state pass and the erase operation may be ended.

In operation. S902, when the finger verify operation is in an activated state (YES), an even verify operation (S904) is performed. In the even verify operation (S904), a first verify voltage VFY1 is applied to the even word-lines WL2, WL4, and WL6 in the cell string and the high voltage VH1 is applied to the odd word-lines WL1, WL3, and WL5. The first verify voltage VFY1 may be an upper limit of a threshold voltage of the erased memory cells MC1 through MC6. The first verify voltage VFY1 may be the ground voltage VSS or a negative (−) voltage.

The first bit line voltage VBL1 is applied to the bit line BL. The first bit line voltage VBL1 may be, for example, the power voltage VCC.

The string selection line voltage VSSL and the ground selection line voltage VGSL may be applied to the string selection line SSL and the ground selection line GSL, respectively, to turn on the string selection transistor SST and the ground selection transistor GST, respectively. According to one embodiment, the power voltage VCC or the non-selected read voltage Vread, that is applied to the non-selected word-lines during the read operation, may be applied to each of the string selection line SSL and the ground selection line GSL.

The common source line voltage VCSL is applied to the common source line CSL. The common source line voltage VCSL may be the ground voltage VSS or a low voltage (including a positive (+) voltage and a negative (−) voltage) having a similar voltage level to the ground voltage VSS.

The substrate voltage VSUB is applied to the substrate 401. The substrate voltage VSUB may be the ground voltage VSS or a low voltage (including a positive (+) voltage and a negative (−) voltage) having a similar level to the ground voltage VSS.

In operation S904, it is identified already in the first erase verify operation (S620 of FIG. 6) that the memory cells MC1, MC3, and MC4 connected to the odd word-lines WL1, WL3, and WL5 having the high voltage VH1 are turned on. When the first verify voltage VFY1 is applied to the even word-lines WL2, WL4, and WL6, the voltage of the bit line BL may change based on a threshold voltage distribution of the memory cells MC2, MC4, and MC6 connected to the even word-lines WL2, WL4, and WL6.

In operation S906, when the memory cells MC1 through MC6 are turned on according to the first verify voltage VFY1, the voltage of the bit line BL decreases from the first bit line voltage VBL1. When the voltage of the bit line BL is lower than the reference voltage Vref, the page buffer in the read and write circuit 130 (FIG. 1) may store, for example, logic low in the first latch 132 (FIG. 1) to which the corresponding bit line BL is connected.

When at least one of the memory cells MC2, MC4, and MC6 connected to the even word-lines WL2, WL4, and WL6 is turned off according to the first verify voltage VFY1, the voltage of the bit line BL is maintained as the first bit line voltage VBL1. When the voltage of the bit line BL is higher than the reference voltage Vref, the page buffer in the read and write circuit 130 may store, for example, logic high in the first latch 132 to which the corresponding bit line BL is connected. The data stored in the first latch 132 of the page buffer may be a result of erase verify reading with respect to the even word-lines WL2, WL4, and WL6.

In operation S908, an odd verify operation is performed. In the odd verify operation (S908), the first verify voltage VFY1 is applied to the odd word-lines WL1, WL3, and WL5 in the cell string and the high voltage VH1 is applied to the even word-lines WL2, WL4, and WL6.

The first bit line voltage VBL1 is applied to the bit line BL. The first bit line voltage VBL1 may be the power voltage VCC.

The string selection line voltage VSSL and the ground selection line voltage VGSL may be applied to the string selection line SSL and the ground selection line GSL, respectively, to turn on the string selection transistor SST and the ground selection transistor GST, respectively. According to an embodiment, the power voltage VCC or the non-selected read voltage Vread, that is applied to the non-selected word-lines during the read operation, may be applied to each of the string selection line SSL and the ground selection line GSL.

The common source line voltage VCSL is applied to the common source line CSL. The common source line voltage VCSL may be the ground voltage VSS or a low voltage (including a positive (+) voltage and a negative (−) voltage) having a similar voltage level to the ground voltage VSS.

The substrate voltage VSUB is applied to the substrate 401. The substrate voltage VSUB may be the ground voltage VSS or a low voltage (including a positive (+) voltage and a negative (−) voltage) having a similar level to the ground voltage VSS.

In operation S908, it is identified already in the first erase verify operation (S620 of FIG. 6) that the memory cells MC2, MC4, and MC6 connected to the even word-lines WL2, WL4, and WL6 having the high voltage VH1 are turned on. When the first verify voltage VFY1 is applied to the odd word-lines WL1, WL3, and WL5, the voltage of the bit line BL may change based on a threshold voltage distribution of the memory cells MC1, MC3, and MC5 connected to the odd word-lines WL1, WL3, and WL5.

In operation S910, when the memory cells MC1 through MC6 are turned on according to the first verify voltage VFY1, the voltage of the bit line BL decreases from the first bit line voltage VBL1. When the voltage of the bit line BL is lower than the reference voltage Vref, the page buffer in the read and write circuit 130 (FIG. 1) may store, for example, logic low in the second latch 134 (FIG. 1) to which the corresponding bit line BL is connected.

When at least one of the memory cells MC1, MC3, and MC5 connected to the odd word-lines WL1, WL3, and WL5 is turned off according to the first verify voltage VFY1, the voltage of the bit line BL is maintained as the first bit line voltage VBL1. When the voltage of the bit line BL is higher than the reference voltage Vref, the page buffer in the read and write circuit 130 may store, for example, logic high in the second latch 134 to which the corresponding bit line BL is connected. The data stored in the second latch 134 of the page buffer may be a result of erase verify reading with respect to the odd word-lines WL1, WL3, and WL5.

In operation S912, an XOR operation is performed with respect to the result of erase verify reading with respect to the even word-lines WL2, WL4, and WL6 stored in the first latch 132 and the result of erase verify reading with respect to the odd word-lines WL1, WL3, and WL5 stored in the second latch 134. Also, as a result of the XOR operation, a first logic value, for example, the number of logic highs (bit "1") is counted.

The result of the XOR operation being logic high may correspond to the case where the threshold voltage distribution of the memory cells MC2, MC4, and MC6 connected to the even word-lines WL2, WL4, and WL6 and the threshold voltage distribution of the memory cells MC2, MC4, and MC6 connected to the odd word-lines WL1, WL3, and WL5 differ from each other, as illustrated in FIG. 10A.

In FIG. 10A, the threshold voltage distribution E of the even word-lines WL2, WL4, and WL6 and the threshold voltage distribution O of the odd word-lines WL1, WL3, and WL5 do not overlap each other in region A, which is a region equal to or higher than the first verify voltage VFY1. Region A may have logic high as the result of the XOR operation XOR.

The result of the XOR operation being logic low may correspond to the case where the threshold voltage distribution E of the even word-lines WL2, WL4, and WL6 and the threshold voltage distribution O of the odd word-lines WL1, WL3, and WL5 are equal to or lower than the first verify voltage VFY1, as illustrated in FIG. 10B.

Also, the result of the XOR operation being logic low may correspond to the case where the threshold voltage distribution E of the even word-lines WL2, WL4, and WL6 and the threshold voltage distribution O of the odd word-lines WL1, WL3, and WL5 exist in a region B, that is equal to or greater than the first verify voltage VFY1 and shapes of the threshold voltage distributions E and O are the same, as illustrated in FIG. 10C.

In the second erase verify operation, a difference between the threshold voltage distribution E of the even word-lines WL2, WL4, and WL6 and the threshold voltage distribution O of the odd word-lines WL1, WL3, and WL5 may be verified. Thus, even if the threshold voltage distributions E and O exist in the region B, that is equal to or greater than first verify voltage VFY1, the threshold voltage distributions E and O are the same. Thus, the second erase verify operation may be determined as an erase pass.

In operation 5914, the number of logic highs (bit "1") of the XOR operation is compared with a first value $NUM_{ECC}$. The first value $NUM_{ECC}$ denotes the number of bits of the error correction unit for correcting errors of data read from the non-volatile memory device 100 (FIG. 1). The XOR operation unit 142 (FIG. 1) of the voltage generator and the control logic 140 (FIG. 1) may process the memory block BLKi as an erase state pass and end the erase operation, when the number of logic highs (bit "1") of the XOR operation is equal to or less than the first value $NUM_{ECC}$, in operation 5903.

The XOR operation unit 142 may process the memory block BLKi as an erase state fail and end the erase operation, when the number of logic highs (bit "1") of the XOR operation is greater than the first value $NUM_{ECC}$, in operation 5916.

Figure 11:
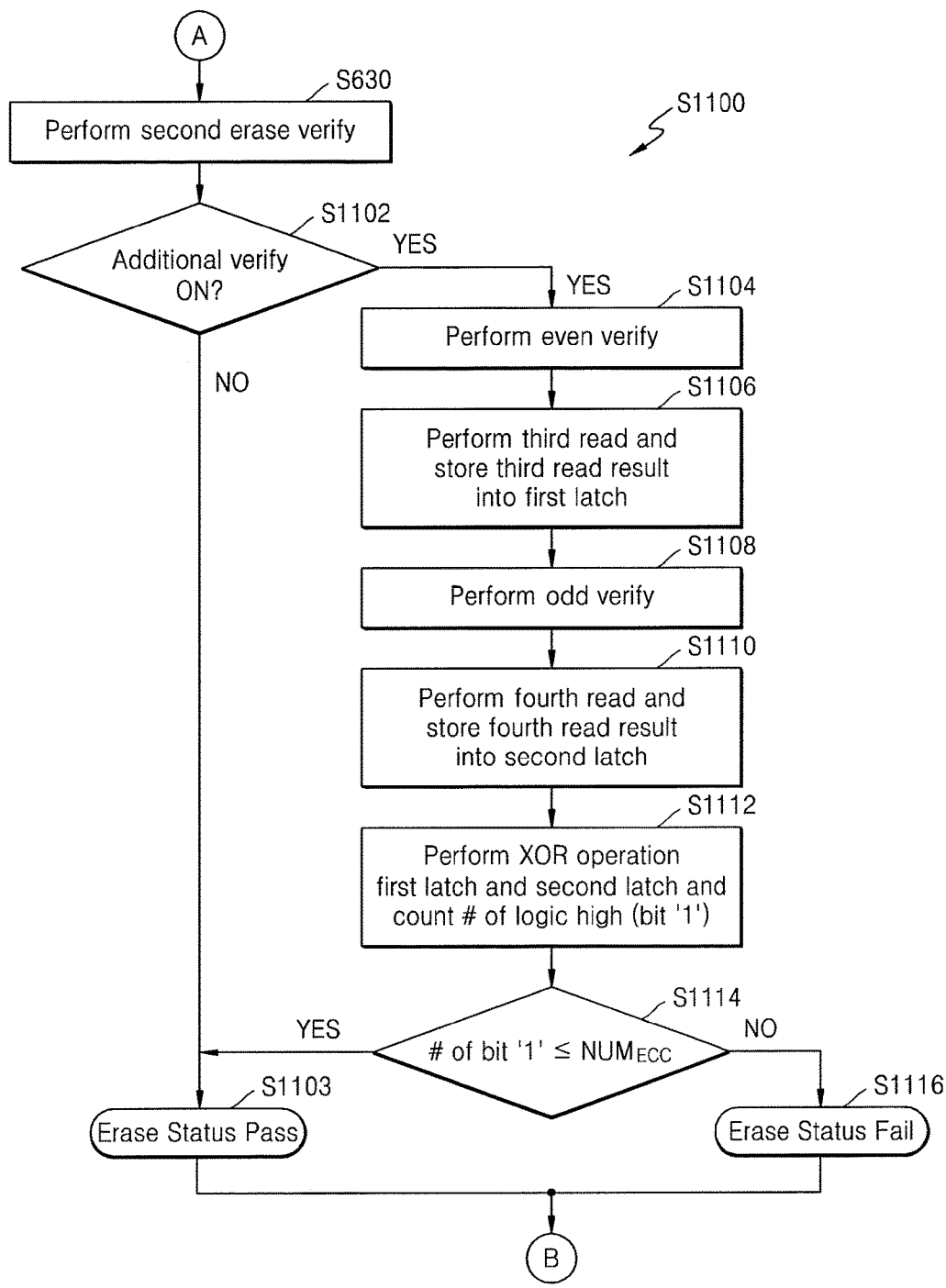
FIG. 11 illustrates another embodiment of an erase verify operation.

FIG. 11 illustrates an embodiment of an additional erase verify operation (S1100), which may be performed after the second erase verify operation of FIG. 6.

Referring to FIGS. 1, 7, and 9, the additional erase verify operation (S1100) of FIG. 11 may be performed after the second erase verify operation (S630) using the first verify voltage VFY1 in FIG. 9. In the additional erase verify operation S1100, a second verify voltage VFY2 may be used that is different from the first verify voltage VFY1 that is used in the second erase verify operation S630. Thus, an erase fail word-line may be accurately detected.

In operation S1102, whether the memory block BLKi determined as an erase pass in the second erase verify operation (S630) is in a state of the additional erase verify operation is determined. The additional erase verify operation may be controlled by the voltage generator and the control logic 140. When the additional erase verify operation is in a non-activated state (NO), operation S1103 is performed. In operation S1103, the memory block BLKi may be processed as an erase state pass, and an erase operation may be ended.

In operation S1102, when the additional erase verify operation is an activated state (YES), an even verify operation is performed in operation S1104. In the even verify operation (S1104), the second verify voltage VFY2 is applied to the even word-lines WL2, WL4, and WL6 in the cell string, and the high voltage VH1 is applied to the odd word-lines WL1, WL3, and WL5. The second verify voltage VFY2 may be a different voltage from the first verify voltage VFY1. For example, the second verify voltage VFY2 may be a voltage lower than the first verify voltage VFY1.

The first bit line voltage VBL1 is applied to the bit line BL. The first bit line voltage VBL1 may be the power voltage VCC.

The string selection line voltage VSSL and the ground selection line voltage VGSL may be applied to the string selection line SSL and the ground selection line GSL, respectively, to turn on the string selection transistor SST and the ground selection transistor GST, respectively. According to an embodiment, the power voltage VCC or the non-selected read voltage Vread, that is applied to the non-selected word-lines in the read operation, may be applied to each of the string selection line SSL and the ground selection line GSL.

The common source line voltage VCSL is applied to the common source line CSL. The common source line voltage VCSL may be the ground voltage VSS or the low voltage (including a positive (+) voltage and a negative (−) voltage) having a similar voltage level to the ground voltage VSS.

The substrate voltage VSUB is applied to the substrate 401. The substrate voltage VSUB may be the ground voltage VSS or the low voltage (including a positive (+) voltage and a negative (−) voltage) having a similar level to the ground voltage VSS.

In operation S1104, it is identified already, in the first erase verify operation (S620 of FIG. 6) and the finger verify operation (S630 of FIG. 9), that the memory cells MC1, MC3, and MC4 connected to the odd word-lines WL1, WL3, and WL5 of the high voltage VH1 are turned on. When the second verify voltage VFY2 is applied to the even word-lines WL2, WL4, and WL6, the voltage of the bit line BL may change based on a threshold voltage distribution of the memory cells MC2, MC4, and MC6 connected to the even word-lines WL2, WL4, and WL6.

In operation S1106, when the memory cells MC1 through MC6 are turned on in response to the second verify voltage VFY2, the voltage of the bit line BL decreases from the first bit line voltage VBL1. When the voltage of the bit line BL is lower than the reference voltage Vref, the page buffer in the read and write circuit 130 (FIG. 1) may store, for example, logic low in the first latch 132 (FIG. 1) to which the corresponding bit line BL is connected.

When at least one of the memory cells MC2, MC4, and MC6 connected to the even word-lines WL2, WL4, and WL6 is turned off in response to the second verify voltage VFY2, the voltage of the bit line BL is maintained as the first bit line voltage VBL1. When the voltage of the bit line BL is higher than the reference voltage Vref, the page buffer in the read and write circuit 130 may store, for example, logic high in the first latch 132 to which the corresponding bit line BL is connected. The data stored in the first latch 132 of the page buffer may be a result of additional erase verify reading with respect to the even word-lines WL2, WL4, and WL6.

In operation S1108, an odd verify operation is performed. In the odd verify operation (S1108), the second verify voltage VFY2 is applied to the odd word-lines WL1, WL3, and WL5 in the cell string, and the high voltage VH1 is applied to the even word-lines WL2, WL4, and WL6.

The first bit line voltage VBL1 is applied to the bit line BL. The first bit line voltage VBL1 may be the power voltage VCC.

The string selection line voltage VSSL and the ground selection line voltage VGSL may be applied to the string selection line SSL and the ground selection line GSL, respectively, to turn on the string selection transistor SST and the ground selection transistor GST, respectively. According to an embodiment, the power voltage VCC or the non-selected read voltage Vread, that is applied to the non-selected word-lines during the read operation, may be applied to each of the string selection line SSL and the ground selection line GSL.

The common source line voltage VCSL is applied to the common source line CSL. The common source line voltage VCSL may be the ground voltage VSS or the low voltage (including a positive (+) voltage and a negative (−) voltage) having a similar voltage level to the ground voltage VSS.

The substrate voltage VSUB is applied to the substrate 401. The substrate voltage VSUB may be the ground voltage VSS or the low voltage (including a positive (+) voltage and a negative (−) voltage) having a similar level to the ground voltage VSS.

In operation S1108, it is identified already, in the first erase verify operation (S620 of FIG. 6) and the finger verify operation (S630 of FIG. 9), that the memory cells MC2, MC4, and MC6 connected to the even word-lines WL2, WL4, and WL6 of the high voltage VH1 are turned on. When the second verify voltage VFY2 is applied to the odd-word lines WL1, WL3, and WL5, the voltage of the bit line BL may change based on a threshold voltage distribution of the memory cells MC1, MC3, and MC5 connected to the odd word-lines WL1, WL3, and WL5.

In operation 51110, when the memory cells MC1 through MC6 are turned on in response to the second verify voltage VFY2, the voltage of the bit line BL decreases from the first bit line voltage VBL1. When the voltage of the bit line BL is lower than the reference voltage Vref, the page buffer in the read and write circuit 130 (FIG. 1) may store, for example, logic low in the second latch 134 (FIG. 1) to which the corresponding bit line BL is connected.

When at least one of the memory cells MC1, MC3, and MC5 connected to the odd word-lines WL1, WL3, and WL5 is turned off in response to the second verify voltage VFY2, the voltage of the bit line BL is maintained as the first bit line voltage VBL1. When the voltage of the bit line BL is higher than the reference voltage Vref, the page buffer in the read and write circuit 130 may store, for example, logic high in the second latch 134 to which the corresponding bit line BL is connected. The data stored in the second latch 134 of the page buffer may be a result of additional erase verify reading with respect to the odd word-lines WL1, WL3, and WL5.

In operation S1112, the XOR operation is performed with respect to a result of additional erase verify reading with respect to the even word-lines WL2, WL4, and WL6 stored in the first latch 132 and a result of additional erase verify reading with respect to the odd word-lines WL1, WL3, and WL5 stored in the second latch 134. Also, as a result of the XOR operation, a first logic value, for example, the number of logic highs (bit "1"), is counted.

In operation S1114, the number of logic highs (bit "1") of the XOR operation is compared with a first value $NUM_{ECC}$. The XOR operation unit 142 (FIG. 1) of the voltage generator and the control logic 140 (FIG. 1) may process the memory block BLKi as an erase state pass in operation S1103 and end the erase operation, when the number of logic highs (bit "1") of the XOR operation is equal to or less than the first value $NUM_{ECC}$.

The XOR operation unit 142 may process the memory block BLKi as an erase state fail in operation S1116 and end the erase operation, when the number of logic highs (bit "1") of the XOR operation is greater than the first value $NUM_{ECC}$.

Figure 12:
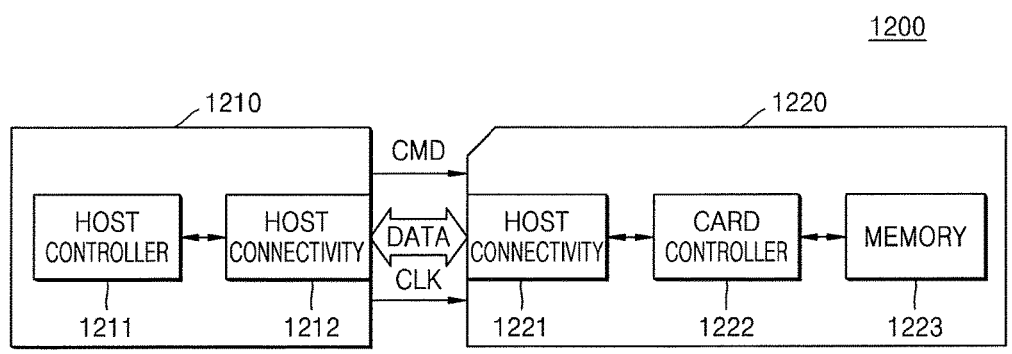
FIG. 12 illustrates an embodiment of a memory card system.

FIG. 12 illustrates an embodiment of a memory card system 1200 including a non-volatile memory device in accordance with one or more of the aforementioned embodiments. Referring to FIG. 12, the memory card system 1200 may include a host 1210 and a memory card 1220. The host 1210 may include a host controller 1211 and a host contact unit 1212. The memory card 1220 may include a card contact unit 1221, a card controller 1222, and a non-volatile memory device 1223.

The non-volatile memory device 1223 may be realized using one or more of the embodiments in FIGS. 1 through 11. The non-volatile memory device 1223 may apply an erase voltage to memory cells of a plurality of cell strings, perform a first read operation by applying a first verify voltage to even words connected to the memory cells of the cell strings and applying a high voltage to odd word-lines, perform a second read operation by applying the first verify voltage to the odd word-lines connected to the memory cells of the cell strings and applying the high voltage to the even word-lines, and perform erase verify operation by performing an XOR operation on a result of the first read operation and a result of the second read operation. The non-volatile memory device 1223 may detect an erase fail word-line by determining an erase pass/fail of the erase verify operation based on the result of the XOR operation.

The host 1210 may write data DATA to the memory card 1220 or read data DATA stored in the memory card 1220. The host controller 1211 may transmit a clock signal CLK generated in a clock generator in the host 1210 and the data DATA to the memory card 1220 via the host contact unit 1212.

The card controller 1222 may provide the data DATA to the non-volatile memory device 1223, by synchronizing the data DATA with the clock signal CLK generated in the clock generator in the card controller 1222, in response to a request received via the card contact unit 1221. The non-volatile memory device 1223 may store the data DATA transmitted from the host 1210.

The memory card 1220 may be realized as a compact flash card (CFC), a microdrive, a smart media card (SMC), a multimedia card (MMC), a security digital card (SDC), a universal flash memory device (UFS), a memory stick, a universal serial bus (USB) flash memory driver, etc.

Figure 13:
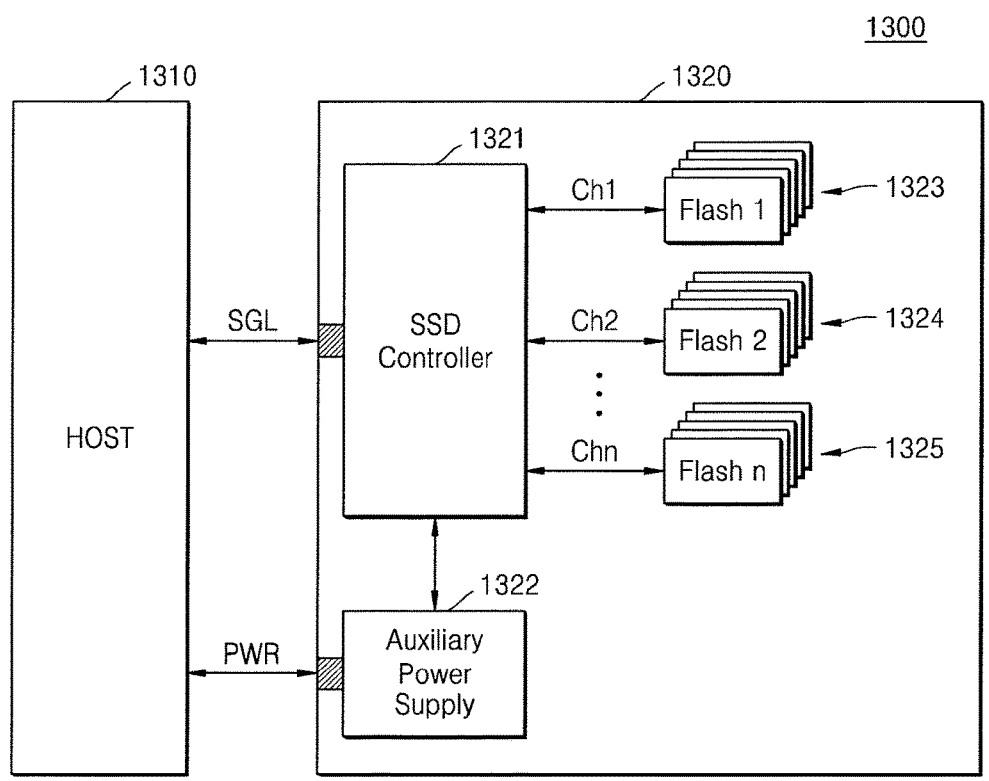
FIG. 13 illustrates an embodiment of a solid state drive system.

FIG. 13 illustrates a solid state drive (SSD) system 1300 including a non-volatile memory device corresponding to any of the aforementioned embodiments. Referring to FIG. 13, the SSD system 1300 may include a host 1310, and a SSD 1320. The SSD 1320 exchanges signals with the host 1310 via a signal connector and receives power via a power connector. The SSD 1320 may include a SSD controller 1321, an auxiliary power device 1322, and a plurality of non-volatile memory devices 1323, 1324, and 1325.

Each of the plurality of non-volatile memory devices 1323, 1324, and 1325 may be any of the embodiments in FIGS. 1 through 11. Each of the non-volatile memory devices 1323, 1324, and 1325 may apply an erase voltage to memory cells of a plurality of cell strings, perform a first read operation by applying a first verify voltage to even word-lines connected to the memory cells of the cell strings and applying a high voltage to odd word-lines, perform a second read operation by applying the first verify voltage to the odd word-lines connected to the memory cells of the cell strings and applying the high voltage to the even word-lines, and perform erase verify operation by performing an XOR operation on a result of the first read operation and a result of the second read operation. Each of the non-volatile memory devices 1323, 1324, and 1325 may detect an erase fail word-line by determining an erase pass/fail of the erase verify operation based on the result of the XOR operation.

The methods, processes, and/or operations described herein may be performed, in whole or part, by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The voltage generators, control logic, circuits, and other processing features of the embodiments disclosed herein may be implemented in logic which, for example, may include hardware, software, or both. When implemented at least partially in hardware, the voltage generators, control logic, circuits, and other processing features may be, for example, any one of a variety of integrated circuits including but not limited to an application-specific integrated circuit, a field-programmable gate array, a combination of logic gates, a system-on-chip, a microprocessor, or another type of processing or control circuit. While XOR logic is mentioned in connection with one or more of the aforementioned embodiments, the XOR logic may be replaced with other types of logic circuits for comparing or otherwise processing the results described herein.

When implemented in at least partially in software, the voltage generators, control logic, circuits, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods herein.

Example embodiments have been disclosed herein, and although specific terms are employed, they are used and are to be interpreted in a generic and descriptive sense only and not for purpose of limitation. The embodiments may be combined to form additional embodiments, In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A method of operating a non-volatile memory device, including a plurality of cell strings, each of the cell strings including a plurality of memory cells, the method comprising:
    supplying an erase voltage to the memory cells of each of the cell strings;
    performing a first read operation by applying a first verify voltage to even word-lines connected to the memory cells of each of the cell strings and applying a high voltage to odd word-lines connected to the memory cells of each of the cell strings;
    performing a second read operation by applying the first verify voltage to the odd word-lines connected to the memory cells of each of the cell strings and applying the high voltage to the even word-lines connected to the memory cells of each of the cell strings; and
    performing a first erase verify operation by performing a first exclusive-or (XOR) operation on a result of the first read operation and a result of the second read operation.

2. The method as claimed in claim 1, wherein the first erase verify operation includes:
    when a threshold voltage distribution of the memory cells connected to the even word-lines connected to the memory cells of each of the cell strings is different from a threshold voltage distribution of the memory cells connected to the odd word-lines connected to the memory cells of each of the cell strings when a voltage equal to or higher than the first verify voltage is applied, the first erase verify operation is processed as an erase fail.

3. The method as claimed in claim 1, wherein the first erase verify operation includes:
    when a threshold voltage distribution of the memory cells connected to the even word-lines connected to the memory cells of each of the cell strings is same as a threshold voltage distribution of the memory cells connected to the odd word-lines connected to the memory cells of each of the cell strings when a voltage equal to or higher than the first verify voltage is applied, the first erase verify operation is processed as an erase pass.

4. The method as claimed in claim 1, wherein the first verify voltage is equal to an upper limit of a threshold voltage of erased memory cells.

5. The method as claimed in claim 1, wherein the high voltage is a non-selection read voltage supplied to non-selected word-lines during the first and second read operations.

6. The method as claimed in claim 1, wherein performing the first erase verify operation includes:
    counting a number of first logic values as a result of the first XOR operation;
    processing the first erase verify operation as an erase state fail when the number of first logic values is greater than correctable bits of an error correction unit, which corrects data errors of the non-volatile memory device; and
    processing the first erase verify operation as an erase state pass when the number of first logic values is equal to or less than the correctable bits of the error correction unit.

7. The method as claimed in claim 1, further comprising, when the first erase verify operation is determined as an erase pass:
    performing a third read operation by applying a second verify voltage different from the first verify voltage to the even word-lines connected to the memory cells of each of the cell strings, and applying the high voltage to the odd word-lines connected to the memory cells of each of the cell strings;
    performing a fourth read operation by applying the second verify voltage to the odd word-lines connected to the memory cells of each of the cell strings and applying the high voltage to the even word-lines connected to the memory cells of each of the cell strings; and
    performing a second erase verify operation by performing a second XOR operation on a result of the third read operation and a result of the fourth read operation.

8. The method as claimed in claim 7, wherein the second verify voltage is less than the first verify voltage.

9. The operation method as claimed in claim 7, wherein performing the second erase verify operation includes:
- counting a number of first logic values as a result of the second XOR operation;
- processing the second erase verify operation as an erase state fail and ending an erase operation when the number of first logic values is greater than correctable bits of an error correction unit; and
- processing the second erase verify operation as an erase state pass and ending the erase operation when the number of first logic values is equal to or less than the correctable bits of the error correction unit.

10. A method of operating a non-volatile memory device, including a plurality of cell strings on a substrate, each of the cell strings including a plurality of memory cells stacked in a direction perpendicular to the substrate, the method comprising:
- supplying an erase voltage to the memory cells of each of the cell strings;
- performing a first erase verify operation by applying a high voltage to word-lines connected to the memory cells of each of the cell strings;
- with respect to the cell strings determined as an erase pass, as a result of the first erase verify operation, performing a first read operation by applying a first verify voltage to even word-lines of the word-lines connected to the memory cells and applying the high voltage to odd word-lines of the word-lines connected to the memory cells;
- performing a second read operation by applying the first verify voltage to the odd word-lines of the word-lines connected to the memory cells and applying the high voltage to the even word-lines of the word-lines connected to the memory cells; and
- performing a second erase verify operation by performing a first exclusive-or (XOR) operation on a result of the first read operation and a result of the second read operation.

11. The method as claimed in claim 10, wherein:
- when the first erase verify operation is determined as an erase fail, the first erase verify operation is processed as an erase state fail and an erase operation is ended.

12. The operation method as claimed in claim 10, wherein the second erase verify operation includes:
- when a threshold voltage distribution of the memory cells connected to the even word-lines of the word-lines connected to the memory cells is different from a threshold voltage distribution of the memory cells connected to the odd word-lines of the word-lines connected to the memory cells when a voltage equal to or higher than the first verify voltage is applied, the second erase verify operation is processed as an erase fail.

13. The method as claimed in claim 10, wherein the second erase verify operation includes:
- when a threshold voltage distribution of the memory cells connected to the even word-lines of the word-lines connected to the memory cells is same as a threshold voltage distribution of the memory cells connected to the odd word-lines of the word-lines connected to the memory cells when a voltage equal to or higher than the first verify voltage is applied, the second erase verify operation is processed as an erase pass.

14. The method as claimed in claim 10, further comprising:
- with respect to the cell strings determined as an erase pass as a result of the second erase verify operation, performing a third read operation by applying a second verify voltage different from the first verify voltage to the even word-lines of the word-lines connected to the memory cells and applying the high voltage to the odd word-lines of the word-lines connected to the memory cells;
- performing a fourth read operation by applying the second verify voltage to the odd word-lines of the word-lines connected to the memory cells and applying the high voltage to the even word-lines of the word-lines connected to the memory cells; and
- performing the second erase verify operation by performing a second XOR operation on a result of the third read operation and a result of the fourth read operation.

15. The method as claimed in claim 14, wherein the second verify voltage is less than the first verify voltage.

16. A method for controlling a non-volatile memory, the method comprising:
- performing a first read operation including applying a first voltage to a first number of word lines connected to a plurality of memory cells, and applying a second voltage to a second number of word lines connected to the memory cells;
- performing a second read operation including applying the first voltage to the second number of word lines, and applying the second voltage to the first number of word lines; and
- detecting an erase fail word-line based on results of the first and second read operations, wherein the first voltage is different from the second voltage.

17. The method as claimed in claim 16, wherein:
the first number of word lines are even word lines, and
the second number of word lines are odd word lines.

18. The method as claimed in claim 16, wherein detecting the erase fail word-line includes comparing the results of the first read operation to the results of the second read operation.

19. The method as claimed in claim 18, wherein the comparing includes:
- performing an exclusive-or operation on the results of the first and second read operations.

20. The method as claimed in claim 16, wherein:
the non-volatile memory has a three-dimensional structure, and
the memory cells are arranged in different cell strings of the three-dimensional structure.

* * * * *